(12) United States Patent
Woods et al.

(10) Patent No.: US 7,811,423 B2
(45) Date of Patent: Oct. 12, 2010

(54) PROXIMITY PROCESSING USING CONTROLLED BATCH VOLUME WITH AN INTEGRATED PROXIMITY HEAD

(75) Inventors: Carl A. Woods, Aptos, CA (US); Yezdi N. Dordi, Palo Alto, CA (US); Jacob Wylie, Fremont, CA (US); Robert Maraschin, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 1041 days.

(21) Appl. No.: 11/539,611

(22) Filed: Oct. 6, 2006

(65) Prior Publication Data

US 2008/0296166 A1 Dec. 4, 2008

(51) Int. Cl.
*C25D 17/00* (2006.01)
(52) U.S. Cl. .................................. 204/224 R; 204/225
(58) Field of Classification Search ............. 204/224 R, 204/225; 205/133, 137
See application file for complete search history.

(56) References Cited

U.S. PATENT DOCUMENTS 7,563,348 B2 * 7/2009 Dordi et al. ............. 204/224 R

* cited by examiner

*Primary Examiner*—Luan V Van
(74) *Attorney, Agent, or Firm*—Martine Penilla & Gencarella, LLP

(57) ABSTRACT

A plating assembly for use in plating metallic materials onto a surface of a substrate is provided. The plating assembly comprising a delivery unit having a fluid chamber, a metallic source, and a porous insert. The plating assembly also comprising a receiving unit having a fluid chamber and a metallic receiver. The receiving unit also has a porous insert. The porous insert of the delivery unit being substantially aligned with, and spaced apart from, the porous insert of the receiving unit. The metallic receiver being substantially aligned with the porous insert of the delivery unit and a path being defined between the delivery unit and the receiving unit. Wherein a plating meniscus is capable of being defined in the path between the porous inserts of the delivery unit and the receiving unit and a substrate is capable of being moved through the plating meniscus to enable the plating of metallic materials onto the surface of the substrate. Examples for de-plating are also provided.

18 Claims, 11 Drawing Sheets

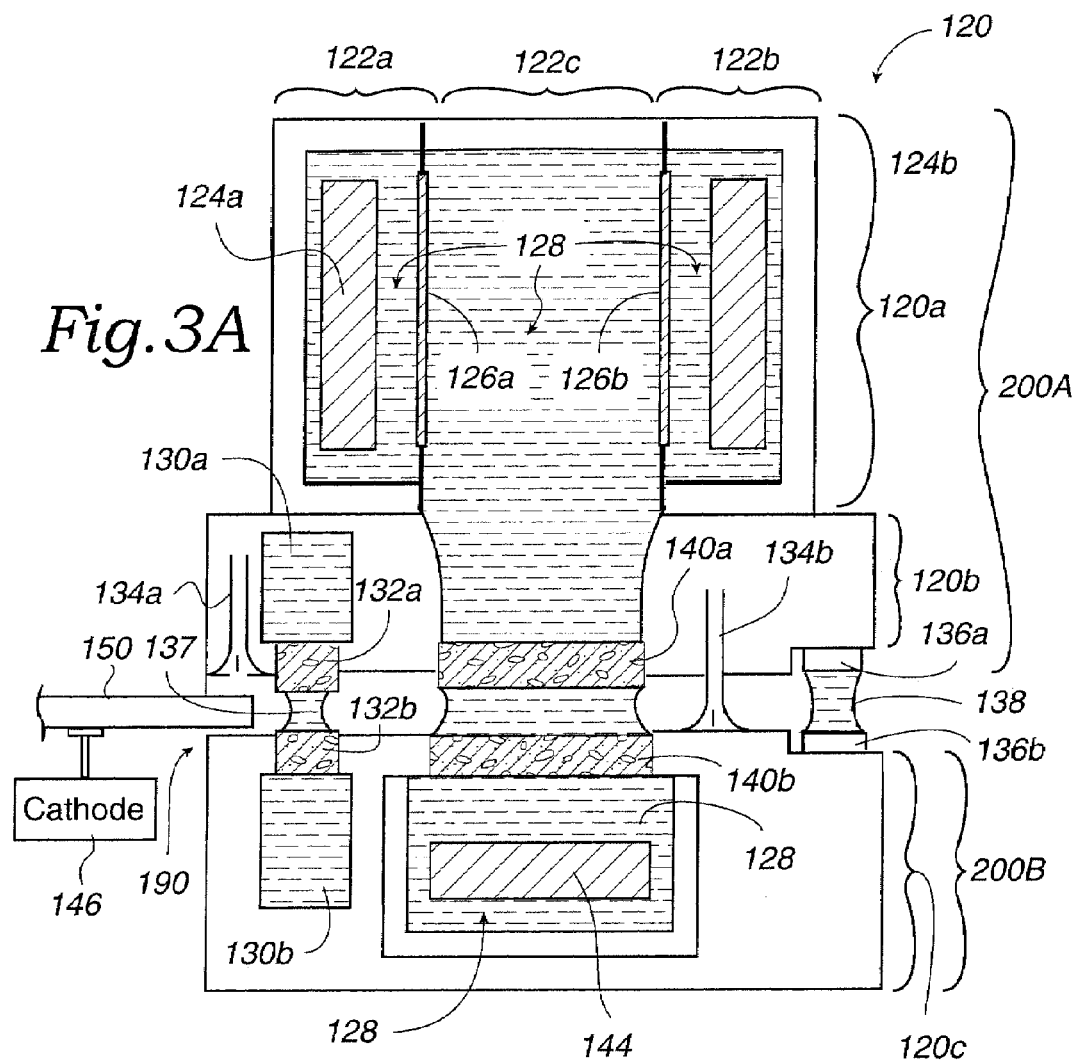
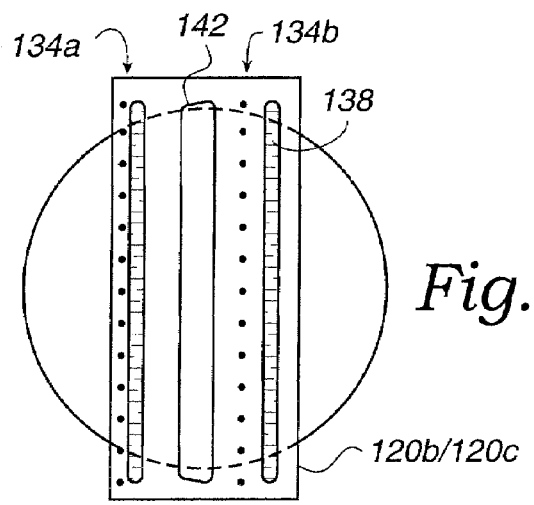

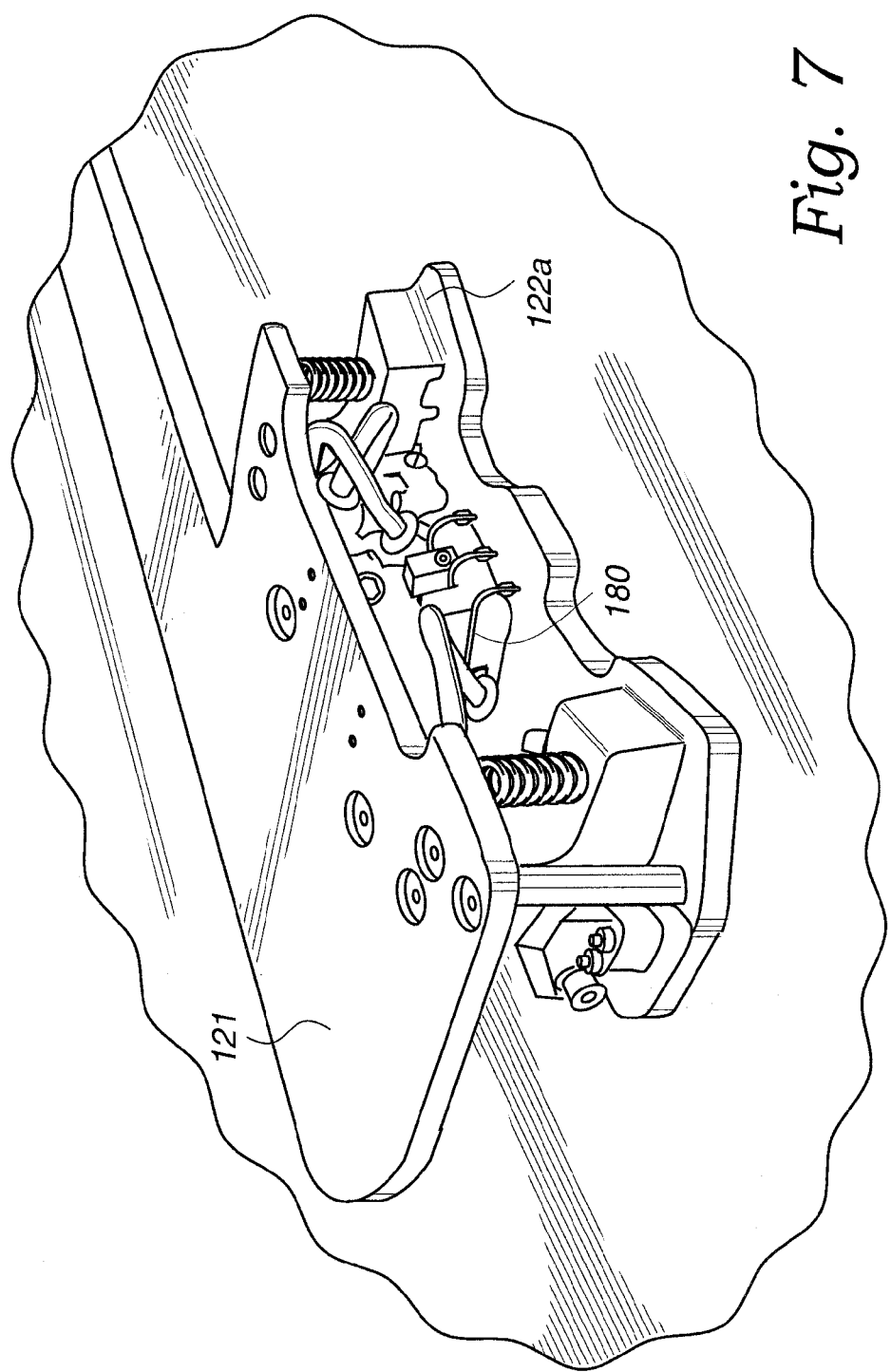

PROXIMITY PROCESSING USING CONTROLLED BATCH VOLUME WITH AN INTEGRATED PROXIMITY HEAD

BACKGROUND OF THE INVENTION

1. Field of the Invention

The present invention relates generally to the processing of semiconductor substrates, and more particularly, the plating of semiconductor substrates.

2. Description of the Related Art

Semiconductor substrate processing may include multiple operations where each operation can be dependent on the previous operation or operations. During processing, a substrate may be subjected to operations such as etching, chemical mechanical polishing, cleaning, and plating. With each operation, it is the possible to create defects or to introduce contaminants that can render the final product inoperable. To maximize output, many precautions may be taken in order to minimize process variables. For example, processing semiconductors in clean room environments is a standard practice intended to minimize processing variables including reducing sources of potential contamination. However, even with the use of clean room environments it may still be desirable to minimize exposure and handling of the semiconductor substrate.

In conjunction with the desire to minimize exposure and handling of the semiconductor substrate is the desire to minimize the use of processing chemicals while processing the semiconductor substrate. Reducing the amount of chemicals used during processing may reduce operating costs. Furthermore, due to the potentially hazardous nature of some of the chemical used, reducing the amount of chemicals used can also result in a safer and healthier environment.

In view of the forgoing, there is a need for improved processing techniques that can minimize both substrate handling and consumption of process chemicals.

SUMMARY

In one embodiment, a substrate plating assembly is disclosed. The substrate plating assembly is comprised of a delivery unit having an exterior surface and an interior chamber capable of housing a consumable plating metal. The interior chamber of the delivery unit is capable of containing a plating fluid and has an opening interfaced by a first porous insert. The opening of the interior chamber allows the plating fluid to move in and out of the interior chamber of the delivery unit. The substrate plating assembly also has a receiving unit having an exterior surface and an interior volume. The receiving unit is capable of housing a metal that facilitates distribution of an electrical field. The interior volume of the receiving unit is configured to hold at least part of the plating fluid. The interior volume of the receiving unit also has an opening interfaced by a second porous insert that allows the plating fluid to move in and out of the interior chamber of the receiving unit. The second porous insert is substantially aligned with the first porous insert, thereby defining a plating meniscus from the plating fluid between the first and second porous inserts. A substrate path is defined by a distance separating the delivery unit and the receiving unit while the meniscus is formed between the first porous insert and the second porous insert in the substrate path. Wherein the substrate path is configured to provide passage for a substrate. A surface of the substrate capable of being metallically plated when exposed to the plating fluid of the plating meniscus as the substrate is moves through the substrate path between the delivery unit and the receiving unit.

In another embodiment a plating assembly for use in plating metallic materials onto a surface of a substrate is disclosed. The plating assembly comprising a delivery unit having a fluid chamber, a metallic source, and a porous insert. The plating assembly also comprising a receiving unit having a fluid chamber and a metallic receiver. The receiving unit also has a porous insert. The porous insert of the delivery unit being substantially aligned with, and spaced apart from, the porous insert of the receiving unit. The metallic receiver being substantially aligned with the porous insert of the delivery unit and a path being defined between the delivery unit and the receiving unit. Wherein a plating meniscus is capable of being defined in the path between the porous inserts of the delivery unit and the receiving unit and a substrate is capable of being moved through the plating meniscus to enable the plating of metallic materials onto the surface of the substrate.

In yet another embodiment, a method for plating a substrate is disclosed. The method comprising forming a meniscus from a electrolytic fluid, the meniscus being formed between a plating source and a plating facilitator. The method also includes moving a substrate through a path that intersects the meniscus and the substrate being charged so that plating material in the plating fluid are attracted to a surface of the substrate when the meniscus is present on the surface of the substrate. Further included in the method is moving the substrate through the meniscus enabling plating across the surface of the substrate. Additionally, the method includes inducing a charge through the meniscus, such that a charge from the plating source is substantially uniformly directed toward the plating facilitator.

In another embodiment, a method for de-plating a substrate is disclosed. The method comprising forming a meniscus from an electrolytic fluid, the meniscus being formed between a first metallic material and a second metallic material. The method further includes placing the substrate at a location that intersects the meniscus and the substrate being charged so that metallic material from a surface of the substrate is attracted away from the surface of the substrate toward one of either the first metallic material or the second metallic material.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

FIG. 3A is a cross-section of a plating assembly in accordance with one embodiment of the present invention.

FIG. 3B is a schematic showing the different areas of the substrate path in accordance with one embodiment of the present invention.

FIG. 7 shows a schematic of the gripper 121 in accordance with one embodiment of the present invention.

DETAILED DESCRIPTION

An invention is disclosed for devices and methods for performing a plating operation on a surface of a substrate. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention. The various embodiments will thus be described in accordance with the order of the drawings, but without limitation to any particular structure or configuration, as they are provided to illustrate the many permutations, combinations and/or alternatives, within the spirit and broad scope of the enumerated claims.

Figure 1:
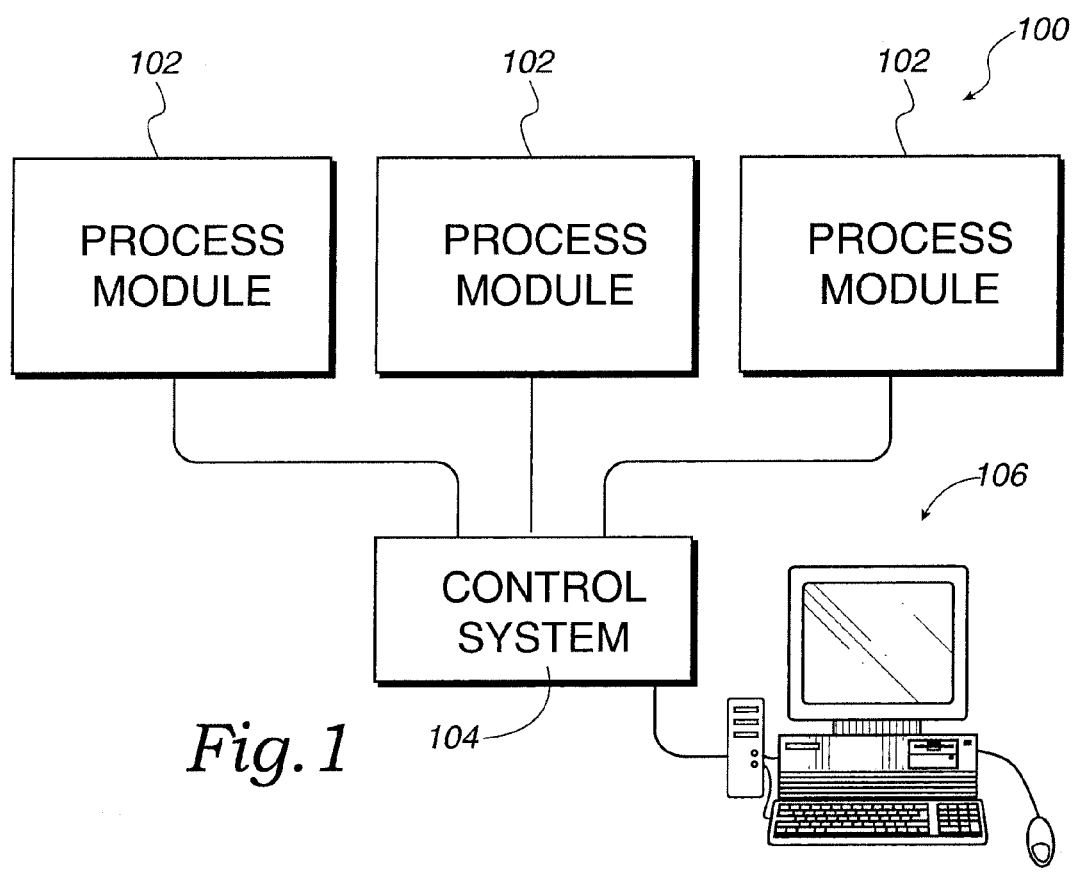
FIG. 1 is a high level schematic of substrate processing apparatus in accordance with one embodiment of the present invention.

FIG. 1 is a high level schematic of substrate processing apparatus 100 in accordance with one embodiment of the present invention. The substrate processing apparatus 100 can contain a single or multiple process modules 102. The process modules 102 can perform a variety of processing including, but not limited to, etching, cleaning, plating, and other substrate preparation operations. The process modules 102 are connected to a control system 104. The control system 104 can be physically separated from the process module 102 as shown, or an integrated component within the process module 102. The control system 104 can be used to ensure the required processing conditions and operations are achieved within the processing module 102. The control system 104 can also monitor and control movement of substrate material between process modules 102. The control system 104 is connected to a computer 106. The computer 106 can be used to adjust and monitor the performance of the processing apparatus 100 through the control system 104. In one embodiment, the control system 104 can be connected to a network, such as the Internet, to enable remote setup, operation, and control.

Figure 2:
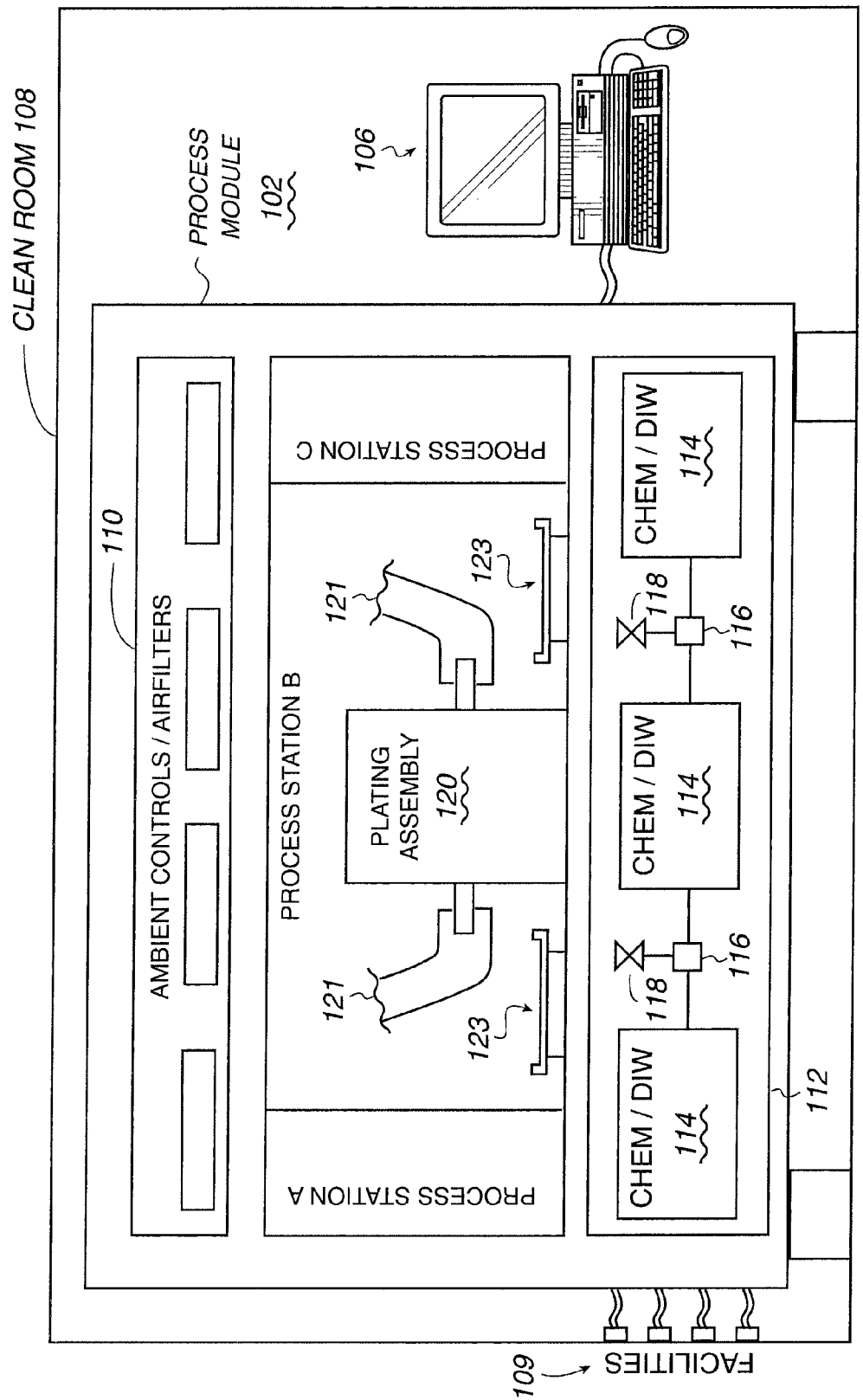
FIG. 2 is a high level schematic of a process module in accordance with one embodiment of the present invention.

FIG. 2 is a high level schematic of a process module 102 in accordance with one embodiment of the present invention. In this embodiment, the process module 102 is connected to computer 106 and the control system 104 of FIG. 1. The process module 102 may be located in a clean room 108. The clean room 108 can include facilities 109 that can provide fluids and gases used by the process module 102. The process module 102 includes gas controls 110 and fluid controls 112. The gas controls 110 can include air filters, gas valves, and devices to control the temperature and humidity of gases used in the process module. The fluid controls 112 can include fluid handlers 114, flow controllers 116, and valves 118. In one embodiment the fluid handlers 114 can be used to store process chemicals and de-ionized water. The flow controllers 116 and valves 118 can be used to control the mixing and dispensing of fluids.

The process module 102 can have a single process station or multiple process stations. It should be clear that a process module could contain fewer or more process stations than shown in FIG. 2. The individual process station can perform one, or a combination of processes including, but not limited to, plating, etching, cleaning or other operations typically used in the semiconductor processing environment. For simplicity, process station A and process station C are shown as blocks. In one embodiment Process station B includes a plating assembly 120, grippers 121 and substrate handlers 123. When a gripper 121 is not manipulating a substrate 150, the substrate handlers 123 can control the movement of the substrate 150 within the process station. The gripper 121 is used to move the substrate 150 from a substrate handler 123 through the plating assembly 120. In one embodiment there is a gripper 121 on each side of the plating assembly and the substrate 150 is handled by both of the grippers 121 as the substrate 150 emerges from the plating assembly 120. In one embodiment, the grippers 121 also provide an electrical connection to facilitate plating, as will be described below. After passing through the plating assembly the substrate 150 is placed on a substrate handler 123.

FIG. 3A is a cross-section of a plating assembly 120 in accordance with one embodiment of the present invention. The plating assembly 120 includes a delivery unit 200A and a receiving unit 200B. A distance separating the delivery unit 200A from the receiving unit 200 defines a substrate path 190 through which the substrate 150 can pass. In one embodiment, the substrate path 190 is defined by a separation gap that will enable passage of a substrate, and the separation gap may vary depending on the thickness of the substrate. In an embodiment where the substrate is a semiconductor wafer, the separation gap will range from between about 5 mm and about 0.5 mm, and more particularly between about 4 mm and about 1.5 mm, and in a specific embodiment about 3 mm.

In one embodiment, the delivery unit 200A includes a top section 120a, a mid-section 120b and the receiving unit 200B includes a bottom section 120c. The top section 120a may include an anode chamber 122a and an anode chamber 122b attached to a plating fluid chamber 122c. The anode chambers 122a and 122b contain anodes 124a and 124b, respectively. The anode, or first charge source, may be composed of a metal that is consumed during an electroplating reaction. In one embodiment the anode, or plating source, is made from a copper containing material, substantially pure copper, or copper alloy. In other embodiments the anodes 124a and 124b are made from different electroplating materials. The plating fluid chamber 122c along with anode chamber 122a and anode chamber 122b may be filled with a plating fluid 128. In one embodiment the plating fluid 128 is an electrolytic solution selected because of the ability to promote electroplating.

The anodes 124a and 124b may need to be replaced after being consumed during the electroplating process. The electroplating process (and the consumption of the anodes) may extend to the plating of one substrate to many substrates, depending on the thickness being plated and other factors. Membranes 126a and 126b are placed between the plating fluid chamber 122c and the respective anode chambers 122a and 122b. In this embodiment, the membranes 126a and 126b retain most of the plating fluid 128 within the plating fluid chamber 122c but allow the passage of copper ions from the anode chambers 122a and 122b to the plating fluid chamber 122c. In one embodiment, mechanically, the membranes 126a and 126b enable the removal of the respective anode chambers 122a and 122b, without requiring draining of the plating fluid 128. Because the anodes 124a and 124b can be replaced without draining the plating fluid 128, downtime for the plating assembly 120 is minimized. It should be noted that the use of two anodes in the orientation shown in FIG. 3A is merely one embodiment of the top section 120. Other embodiments of the top section 120a may have more or fewer anodes in different orientations.

The top section 120a is attached to the mid-section 120b. In one embodiment, the mid-section 120b includes a pre-wet top head 130a, a pre-wet porous insert 132a, curtain gas inlet 134a, a curtain gas inlet 134b, a rinse/dry top head 136a and a porous plating insert 140a. The pre-wet top head 130a may contain a pre-wet fluid and an opening to the substrate path 190 that is interfaced by the pre-wet porous insert 132a. The pre-wet porous insert 132a is saturated with the pre-wet fluid. The curtain gas inlets 134a and 134b direct a flow of pressurized gas toward the bottom section 120c. The curtain gas may be selected from a multitude of inert gases include mixtures of gases. In one embodiment the curtain gas can be composed of pure nitrogen. In other embodiment the curtain gas can be argon or a mixture of nitrogen and argon, IPA, or $CO_2$. A rinse/dry top head 136a includes multiple areas capable of providing vacuum suction and rinsing fluid.

As a component of the delivery unit 200A, the mid-section 120b is configured to accommodate the plating fluid chamber 122c and allow the plating fluid 128 to saturate the porous plating insert 140a, but still allow the plating ions to pass through. In one embodiment the plating fluid chamber 122c extends into the mid-section 120b from the top section 120a. In another embodiment the plating fluid chamber 122c is formed when a cavity of the top section 120a is joined with a cavity in the mid-section 120b. In yet another embodiment the plating fluid chamber 122c is a cavity that extends into the top section 120a from the bottom section 120b. A surface of the porous plating insert 140a is exposed to the substrate path 190. In one embodiment, the choice of material for the porous plating insert 140a is chosen based on the porosity of the material and the viscosity of the plating fluid 128. Materials that can be used for the porous plating insert 140a can include, but are not limited to, porous plastics such as many varieties of nylon and a variety of porous ceramics.

In one embodiment the receiving unit 200B is located below the delivery unit 200A. In the embodiment shown in FIG. 3A the receiving unit 200B is the bottom section 120c. In another embodiment the receiving unit 200B may me made up of multiple assemblies including a bottom section. The receiving unit can be connected to the plating assembly 120b. The bottom section 120c may include a pre-wet bottom head 130b, a pre-wet porous insert 132b, a rinse/dry bottom head 136b, a porous plating insert 140b, and a bottom cathode 144 within a chamber containing plating fluid 128. The pre-wet bottom head 130b can contain the same pre-wet fluid used in the pre-wet top head 130a. An opening from the pre-wet bottom head 130b to the substrate path 190 is interfaced by the pre-wet porous insert 132b. The locations of the porous insert 132a and porous insert 132b allow a pre-wet meniscus 137 of pre-wet fluid to form in the substrate path 190.

The porous plating insert 140b interfaces an opening to a chamber within the bottom section 120c that contains the bottom cathode 144, or second charge source. To facilitate electroplating, plating fluid 128 surrounds the bottom cathode 144, or plating facilitator, and saturates the porous plating insert 140b. Similar to the pre-wet meniscus, the orientation and alignment of the porous plating inserts 140a and 140b allow the formation of a plating meniscus 142 across the substrate path 190. The rinse/dry bottom head 136b is similar to the rise/dry top head 136a. The rinse/dry bottom head 136b includes multiple areas capable of providing vacuum suction and rinsing fluid.

In one embodiment the plating assembly 120 performs a plating operation when a substrate 150 passes through the various menisci and dry/rinse areas intersecting the substrate path 190. During the plating operation the substrate 150 may be held with a first gripper 121 and passed/pushed into the substrate path 190. In one embodiment, an electrical charge with the same polarity as the bottom cathode 144 is applied to the substrate 150 using a cathode 146. In one embodiment the cathode 146 may be incorporated into the first gripper 121. As the substrate 150 enters the substrate path 190 the leading edge of the substrate 150 passes through the curtain gas from curtain gas inlet 134a followed by the pre-wet meniscus 137. As the substrate 150 enters the pre-wet meniscus 137 the curtain gas may help prevent pre-wet fluid from running across the surface of the substrate 150 to the exterior of the plating assembly 120. As previously mentioned, the curtain gas can be an inert gas such as nitrogen, IPA, $CO_2$, argon or a mixture thereof. Because the pre-wet fluid can be used to prepare the substrate 150 for plating, the choice of a pre-wet fluid can vary depending on the particular plating fluid 128 and the type of metal being plated. For example, if a copper sulfate plating solution is being used the pre-wash fluid can include a philic agent to promote copper plating on the substrate 150.

As the substrate 150 enters the plating meniscus 142 the electrical charge applied to the substrate in conjunction with the electrical charge from the bottom cathode 144 attract metal ions in the plating solution 128 to the surface of the substrate 150. After passing through the plating meniscus 142, the substrate 150 passes under the curtain gas inlet 134b. Curtain gas inlet 134b helps to contain the plating fluid 128 and prevent the plating fluid 128 from escaping to the exterior of the plating assembly 120. Note that in this embodiment it is possible for fluid from the pre-wet meniscus 137 to mix with the plating fluid 128. However, curtain gas from both curtain gas inlets 134a and 134b are meant to contain both the pre-wet fluid and the plating fluid 128 within the plating assembly 120. In another embodiment, additional curtain gas inlets between the pre-wet meniscus 137 and the plating meniscus 142 could prevent the mixing of pre-wet fluid and plating fluid 128.

After passing through the curtain gas inlet 134b the substrate 150 encounters a vacuum area surrounding the rinse/dry top head 136a and the rinse/dry bottom head 136b. In one embodiment the rinse/dry top head 136a and the rinse/dry bottom head 136b can define a cleaning area positioned at an exit of the plating assembly. The first vacuum area encountered by the substrate 150 can remove residual plating fluid moisture from the surface of the substrate. After the first vacuum area the substrate 150 passes through the fluid meniscus 138 between the rinse/dry top head 136a and the rinse/dry bottom head 136b. The fluid meniscus 138 is where the now plated surface of the substrate 150 is exposed to rinsing fluids. The rinsing fluids can include de-ionized water, chemicals or a mixture thereof. Other fluids may be used to rinse the substrate and those listed should not be considered inclusive of potential rinsing fluids. After passing through the fluid meniscus 138, the substrate 150 passes through a second vacuum area. The second vacuum area can remove any residual fluid and ensure the substrate 150 is in a substantially dry state. Thus, the substrate 150 can enter the plating assembly 120 dry and exit dry. This is a substantial benefit over other plating systems that require additional assemblies to rinse and dry a substrate after a plating operation.

A second gripper may be waiting to clamp onto the portion of the substrate 150 that exits the plating assembly 120. Because the first gripper would prevent the entire substrate from being plated, the second gripper can pull the substrate 150 through the plating assembly 120. Similar to the first gripper, the second gripper may also be able to apply an electrical charge to the substrate 150 using a cathode 146. At a certain point the first and second grippers may be moving simultaneously, each clamped to the substrate 150. The first gripper may release the substrate 150 while the second gripper continues to move the substrate 150 through the plating assembly 120 while continuing to apply an electrical charge to the substrate.

FIG. 3B is a schematic showing the different areas of the substrate path 190 in accordance with one embodiment of the present invention. The curtain gas inlet 134a are shown as a row of circles that are followed by the pre-wet meniscus 137. The plating meniscus 142 can be seen along with the curtain gas inlets 134b. In another embodiment the curtain gas inlet 134a/b could be a slot that allows the curtain gas to escape into the path 140. The fluid meniscus 138 is visible after the curtain gas inlet 134b. Not shown are the first and second vacuum areas. In one embodiment the vacuum could be drawn through small holes. In another embodiment, the vacuum could be drawn through a slot. Note that the curtain gas inlets 134a/b, pre-wet meniscus 137, plating meniscus 142, and fluid meniscus 138 can be positioned so they extended beyond the edges of the substrate 150. This helps to ensure that the entire surface of the substrate 150 is processed.

Figure 4A:
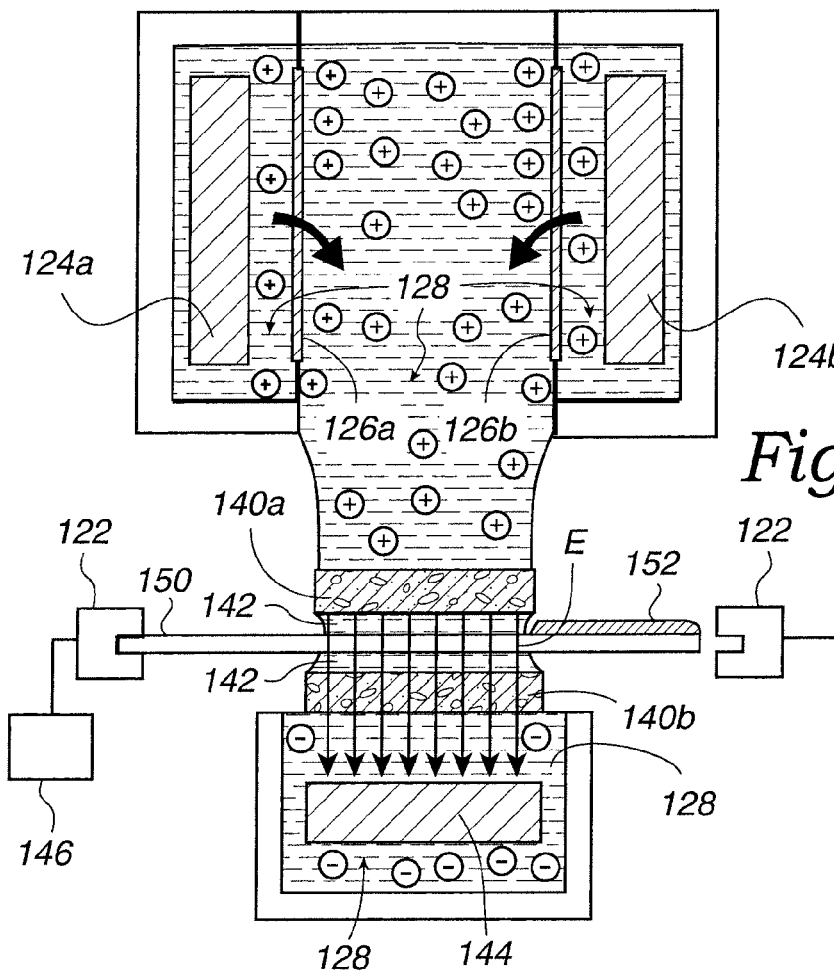
FIGS. 4A and 4B are schematics illustrating the how the bottom cathode promotes an even plating of the substrate in accordance with one embodiment of the present invention.
Figure 4B:
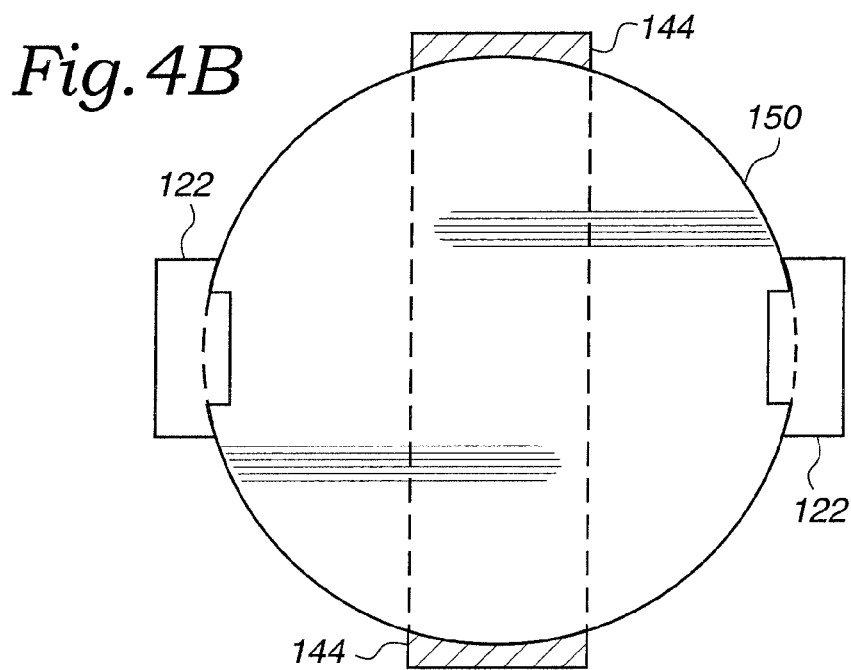

FIGS. 4A and 4B are schematics illustrating the how the bottom cathode 144 promotes an even plating of the substrate 150 in accordance with one embodiment of the present invention. Grippers 122 hold the substrate 150, and as previously discussed, the grippers 122 can apply an electrical charge to the substrate 150 using the cathodes 146. The substrate 150 is guided into the plating meniscus 142 made from plating fluid 128. The anodes 124a/b are consumed during the electrolysis process by release metallic ions (e.g., copper ions Cu+) into the plating fluid 128. The metallic ions are drawn toward the oppositely charged cathode 144 and the substrate 150.

Though the substrate 150 is electrically charged as a cathode, the use of the cathode 144 can help assist in the uniform application of a plating layer 152 on the substrate 150. Using only the substrate 150 as the cathode, or second charge source, it is possible for an uneven deposition of plating material at the edge of the substrate. This uneven plating may be caused of the concentration of the electric field at the edge of the substrate as the substrate moves in or out of the system. As shown in FIG. 4B, the cathode 144 extends beyond the edges of the substrate 150. Thus, the cathode 144 can prevent excessive build up of plating material at the edge of the substrate 150 by providing an even electrical field across the substrate 150, including the edge. Thus, the electric field will be substantially even when the substrate is present, when the substrate is not present, and when the substrate is in transition through the path 190 (e.g., at any stage of progression through the path 190 of the plating assembly 120). This is a particular benefit, as reliance on the substrate 150 as the only cathode can produce the above-mentioned non-uniformities in plating.

Figure 5A:
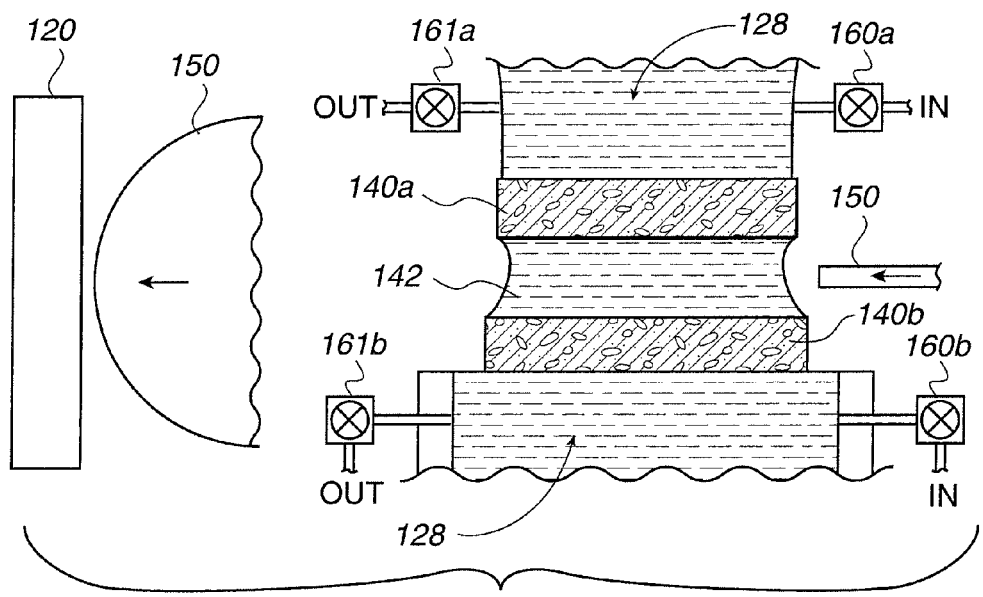
FIGS. 5A-5D illustrate how to control the batch volume of plating fluid 128 within the plating meniscus 142 in accordance with one embodiment of the present invention.

FIGS. 5A-5D illustrate how to control the batch volume of plating fluid 128 within the plating meniscus 142 in accordance with one embodiment of the present invention. For clarity, FIGS. 5A-5D only show the plating meniscus. Note that the techniques used to control the plating meniscus 142 could also be applied to other menisci used in other processes including those in the plating assembly 120. FIG. 5A shows the substrate is seen approaching the plating assembly 120. Before the substrate 150 enters the plating meniscus 142, the plating meniscus is stable. In this case, a stable meniscus means that the plating fluid 128 is contained between the porous plating inserts 140a/b. In one embodiment the volume of the plating meniscus is about 70 mL and the volume of the pre-wet meniscus is about 8 mL. Note that the volume of the plating meniscus and the pre-wet meniscus can be dependent on the size of the substrate being processed. The volume of the menisci can also vary based on the material being plated to the substrate and the speed of the substrate through the processing assembly.

Figure 5B:
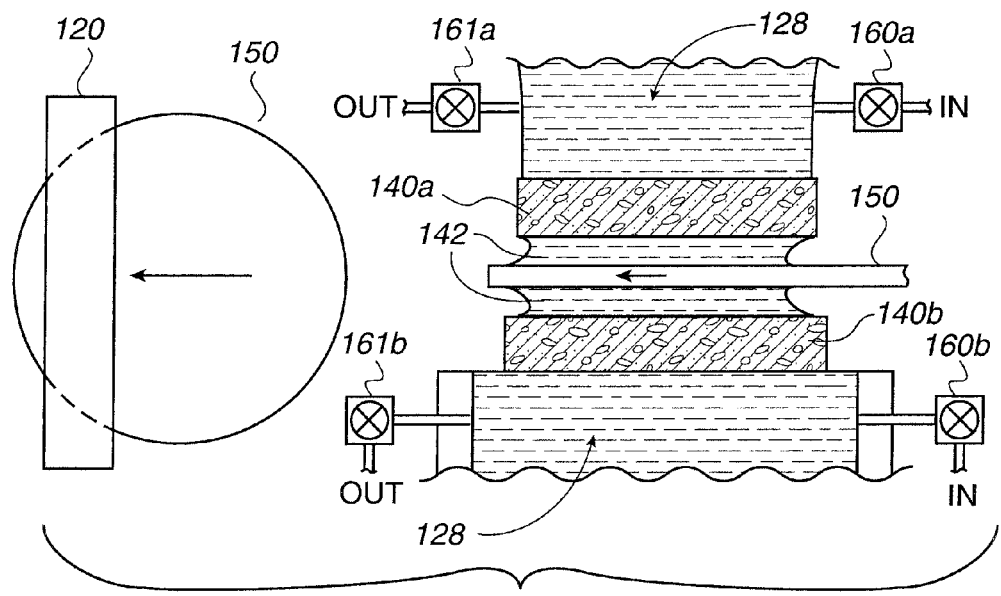

As the substrate 150 moves into the plating meniscus 142, as shown in FIG. 5B, plating fluid 128 is removed from the plating meniscus 142 using fluid control out valves 160a and 160b. The removal rate the plating fluid 128 corresponds with the displacement of plating fluid 128 from the plating meniscus 142 by the intrusion of the substrate 150. By removing plating fluid 128 from the plating meniscus 142 at the same rate the substrate 150 displaces the plating fluid 128, the plating meniscus 142 remains stable. One of the many benefits of maintaining a plating meniscus 142 is the minimization of the plating fluid 128 that is wasted. Another benefit of maintaining a stable plating meniscus 142 is that it is possible to calculate precise volumes of fluids required for a plating process. Another benefit is that the plating meniscus 142 remains contained to the location of process, without dripping or spillage.

Figure 5C:
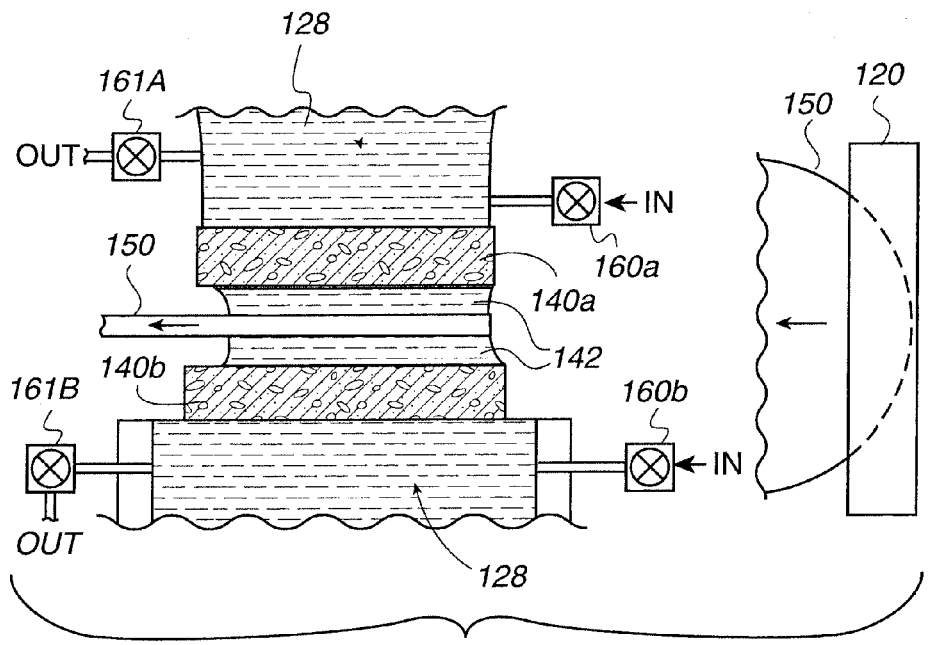
Figure 5D:
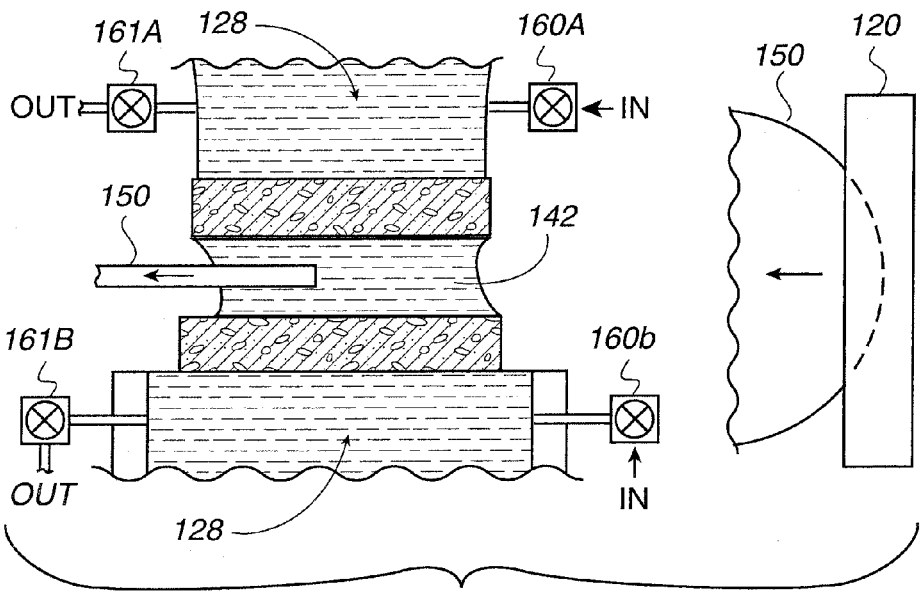

In the embodiment shown in FIGS. 5A-5D the substrate 150 is shown as circular. Therefore, after half of the substrate 150 has been plated plating fluid 128 needs to be added to maintain a stable meniscus. As shown in FIG. 5C, the fluid control valves 160a and 160b can allow the reintroduction of plating fluid 128 at the same rate the displaced volume of plating fluid is decreasing to maintain the stability of the plating meniscus 142. It should be noted that the fluid control valves 160a/b may be used to add and remove fluid from the plating meniscus based on a substrate of any shape and rate of movement. FIG. 5D illustrates the substrate 150 as it exits the plating meniscus 142. The fluid control valves 160a/b continue to add plating fluid 128 in order to compensate for the decreasing displacement of fluid from the substrate 150 and maintain a stable plating meniscus.

Figure 6A:
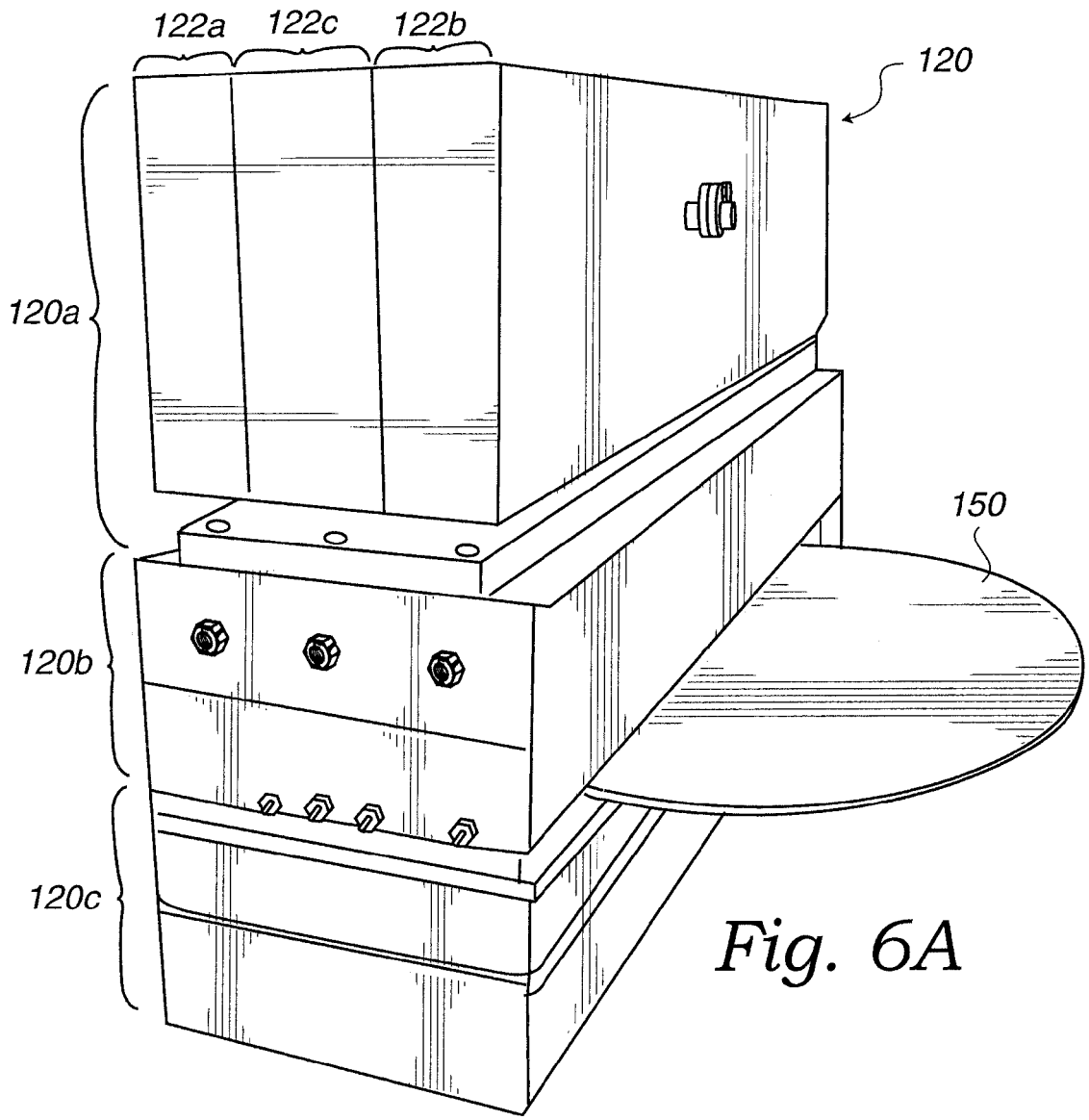
FIG. 6A shows a schematic of a perspective view of the plating assembly in accordance with one embodiment of the present invention.

FIG. 6A shows a schematic of a perspective view of the plating assembly 120 in accordance with one embodiment of the present invention. Visible in FIG. 6A is the top section 120a, mid-section 120b and bottom section 120c. In the embodiment shown in FIG. 6A the anode chamber 122a and 122b are shown connected to the plating fluid chamber 122c. The substrate 150 can be seen partially inserted into the substrate path 190. Also shown on the embodiment of mid-section 120b are multiple ports to the interior chambers of the plating assembly 120. Note that the ports shown in FIG. 6A are exemplary and should not inclusive of the possible ports on the plating assembly 120. The ports can be used to supply the curtain gas or processing fluids such as de-ionized water, isopropyl alcohol, carbon dioxide, inert gases, or plating fluid. The ports can also be used to draw a vacuum for the rinse/dry head. The plating assembly 120, although shown in isolation, is in one embodiment, connected to a module. The module can either be a self-contained module or can be a multiple station module. A plating module, in a broad sense, is a unit that will hold the plating assembly 120, and can accept substrates to be plated in a dry state and output substrates in a dry state. The plating module can therefore be integrated with other modules, such as etching modules, chemical mechanical polishing modules, etc. Within the plating module, the ambient environment can also be controlled, so that a desired level of controlled plating can be achieved. In one embodiment, the controlled ambient can be a reduced oxygen ambient, that will assist in reducing oxidation after the plating operation is complete. Of course, other uses implementations of the plating module can also take place.

Figure 6B:
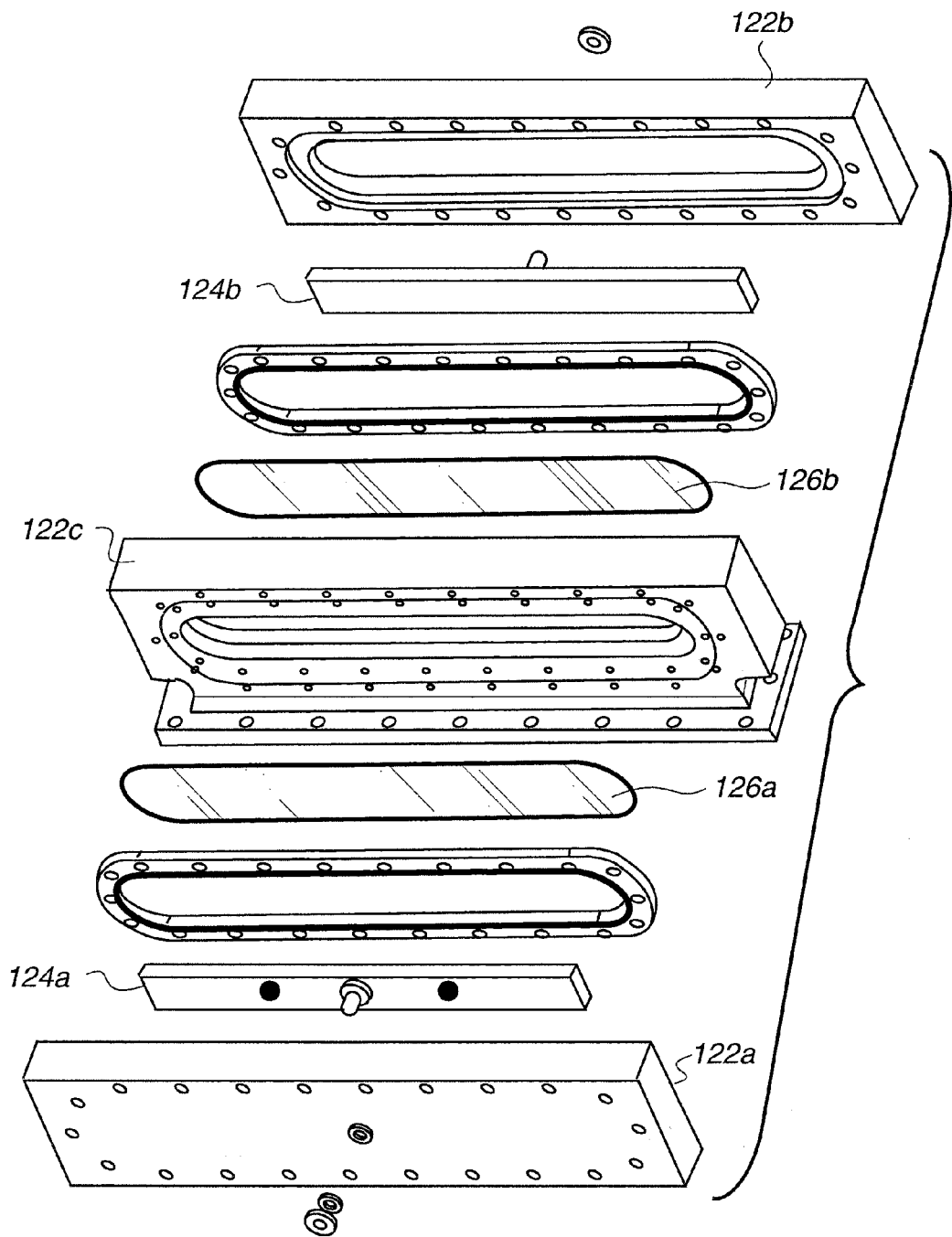
FIG. 6B shows a schematic of an exploded view of the top section in accordance with one embodiment of the present invention.

FIG. 6B shows a schematic of an exploded view of the top section 120a in accordance with one embodiment of the present invention. The plating fluid chamber 122c is shown along with frames 154a/b and membranes 126a/b. The frames 154a/b can be used to hold the membranes 126a/b. In one embodiment the plating fluid chamber 122c includes recessed areas to accommodate the frames 154a/b and the membranes 126a/b. The frames 154a/b and corresponding membranes 126a/b may be attached to the plating fluid chamber 122c using a variety of fastening techniques including mechanical fasteners, adhesives, etc.

As previously discussed, the membranes 126a/b retain most of the plating fluid within the plating fluid chamber while allowing the passage of electroplating ions from the anodes 124a/b. As shown in FIG. 6B, the anodes 124a/b and the anode chambers 122a/b can be attached to the plating fluid chamber 122c using mechanical fasteners such as screws. In other embodiments different fastening techniques may be used such as adhesives. The anodes 124a/b may include features that facilitate attaching the anodes 124a/b to the anode chamber 122a/b.

Because substrate processing can be highly sensitive to contamination the choice of material for the plating fluid chamber 122c and anode chambers 122a/b can include, but are not limited to, plastics and other materials that do not create contaminants when exposed to an electroplating environment. One example of a plastic that can be used for the plating fluid chamber 122c and the anode chamber 122a/b is polycarbonate. Because the anodes are consumed during the electroplating process, the use of a clear or substantially clear polycarbonate for the anode chambers 122a/b enables visual inspection of the anodes to determine if an anode requires replacement. The frames 154a/b can also be made from a plastic such as polycarbonate. However, because the frames 154a/b are internal components the toughness and transparent qualities of polycarbonate are not necessary. Thus, the frames 154a/b can also be made from plastics such as nylon.

FIG. 7 shows a schematic of the gripper 121 in accordance with one embodiment of the present invention. In one embodiment the gripper 121 can include electrodes 180. The electrodes can move from a first position not in contact with the substrate 150 to a second position contacting the substrate 150. When contacting the substrate 150 the electrodes 180 may impart an electrical charge that enables the substrate 150 to act as a cathode. Note that in some embodiments an electrical charge is applied to the substrate 150 when the electrodes contact the substrate. In other embodiments the electrical charge can be controlled so the electrodes 180 may be in contact with the substrate 150 without passing a charge.

Figure 8:
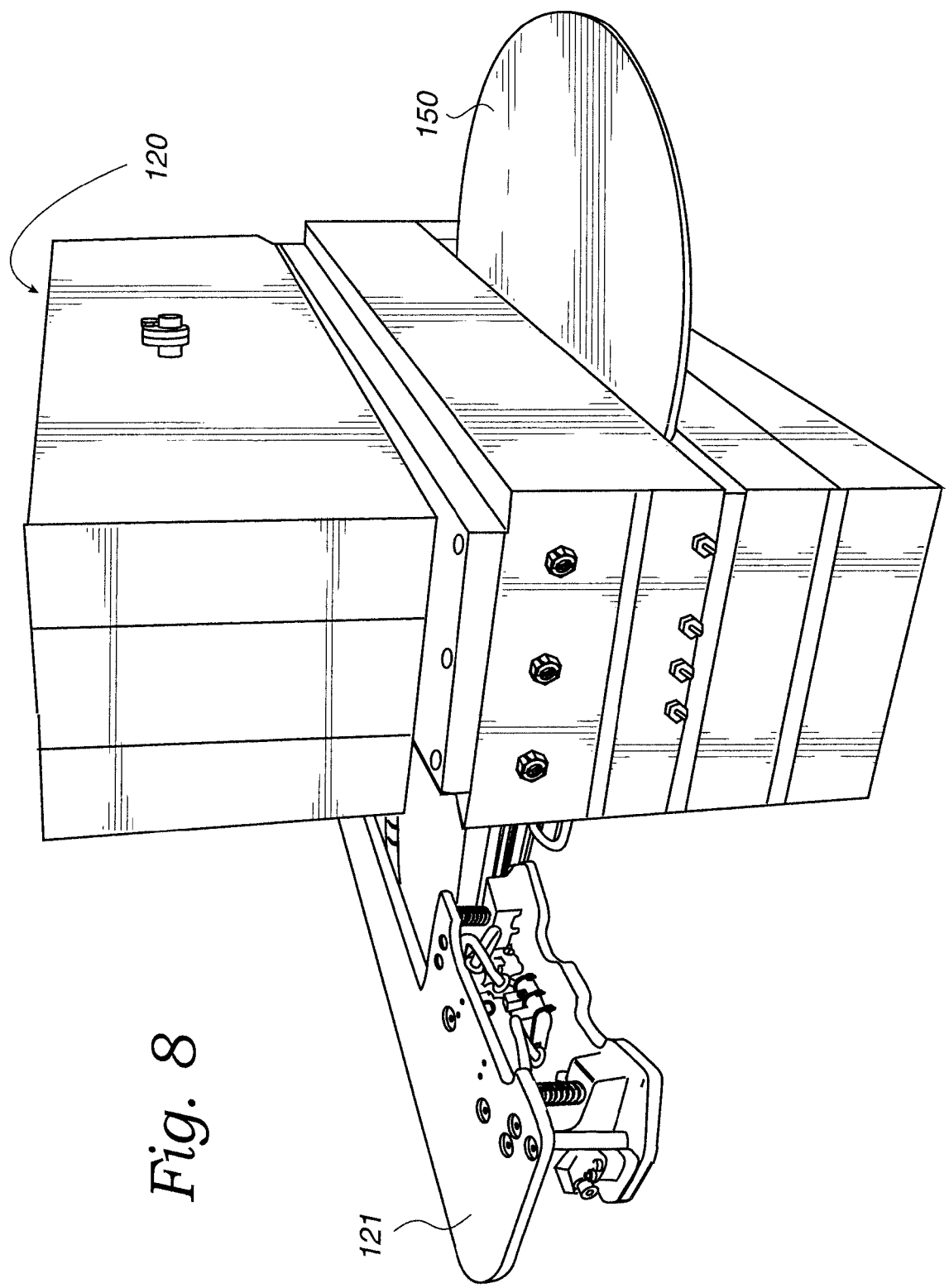
FIG. 8 shows a schematic of the gripper, the plating assembly, and the substrate in accordance with one embodiment of the present invention.

FIG. 8 shows a schematic of the gripper 121, the plating assembly 120, and the substrate 150 in accordance with one embodiment of the present invention. A substrate 150 is shown partially inserted into the plating assembly 120. For clarity, a gripper is not shown holding the substrate 150. The gripper 121 is shown on the output side of the plating assembly 120. In this example, the substrate 150 has not emerged from the plating assembly.

Figure 9:
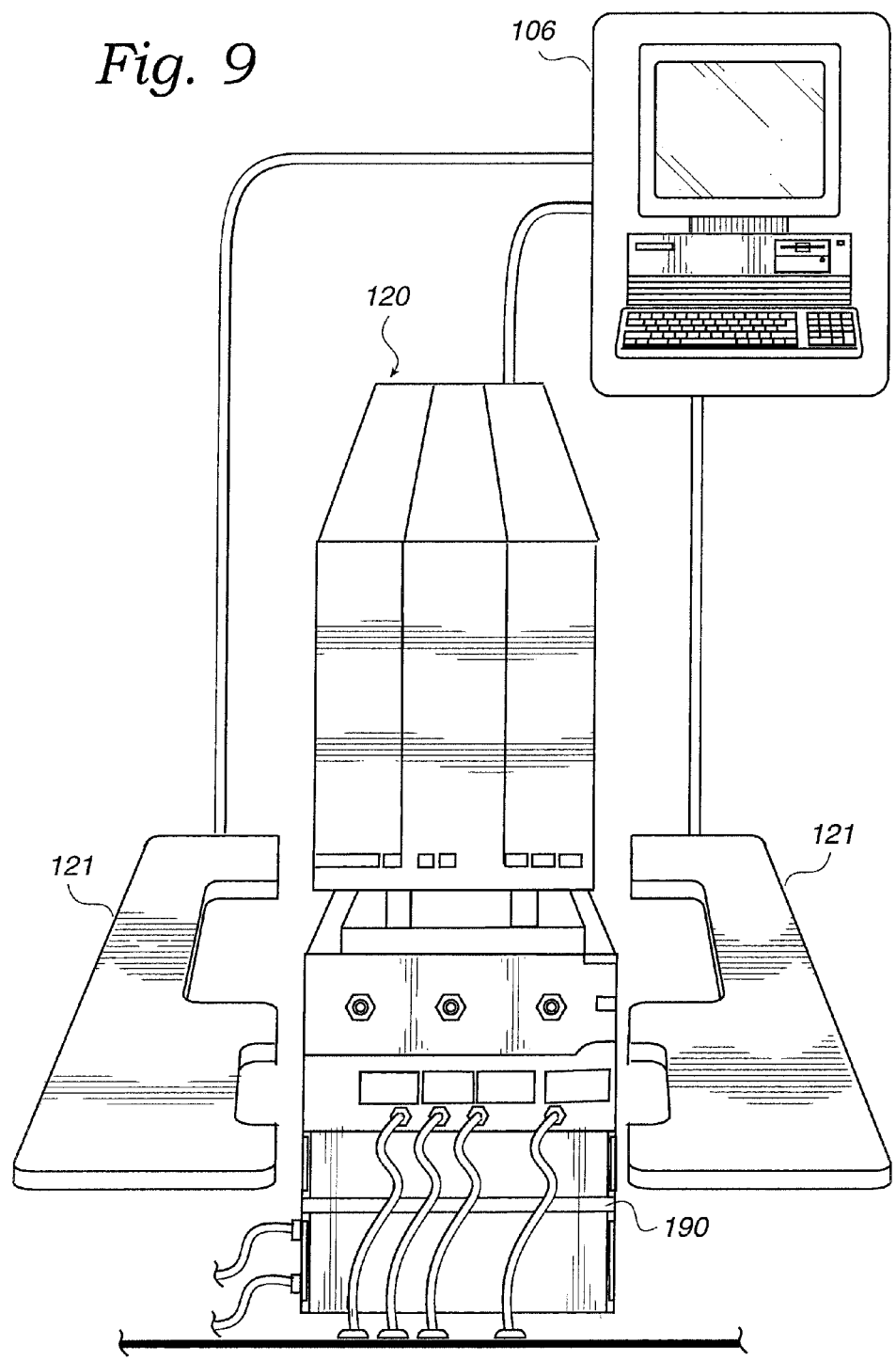
FIG. 9 shows a schematic of a process module that includes the plating module in accordance with one embodiment of the present invention.

FIG. 9 shows a schematic of a process module 102 that includes the plating module 120 in accordance with one embodiment of the present invention. The plating assembly is shown connected to the computer 106. Also connected to the computer 106 are grippers 121. Ports on the plating assembly are attached to facilities.

The ability for the plating assembly 120 to accept a dry substrate 150 and output a plated, clean and dry is enabled by the integration of the rinse/dry head, also known as a proximity head, with the plating assembly 120. One of the many benefits of integrating the proximity head is that the substrate does not need to be moved to a separate clean/dry station either within the process station or within a separate process module. Because the substrate does not need to travel to another station or module handling of the substrate is reduced and that can reduce the possibility of introducing contaminants to the substrate. Another benefit of integrating the proximity head with the plating assembly may be the reduction in the physical footprint of the process station and process module. Since a separate process station or process module is no longer required to rinse/dry the substrates the process stations and the process modules may be constructed to by physically smaller. Alternatively, the space saved by integrating the proximity head can be used to add different process stations allowing more operations to be performed within a process module.

In another embodiment, the plating apparatus 120 can be used as a de-plating apparatus. With minor modifications, the plating apparatus 120 may be used to remove a metallic material from the surface of a substrate material. The modifications may include, but are not limited to, reversing the polarity of the electrodes. Thus, the cathode in the plating operation becomes an anode for a de-plating operation. Similarly, the polarity of the charge applied to the substrate may also be reversed, thereby making the substrate an anode. Furthermore, the polarity of the plating anode may be reversed resulting in the plating anode becoming a de-plating cathode. Additional modification of the plating apparatus may be necessary to enable de-plating including modifications to remove gaseous byproducts of the de-plating process.

Further, during de-plating, the substrate can be placed within the meniscus in many ways. For instance, the substrate can first be placed in a de-plating position and then the de-plating meniscus can be activated and allowed to be placed over the surface of the substrate. The de-plating meniscus can also be formed first, and then the substrate is placed into the meniscus.

In another embodiment, the substrate, once in the de-plating position, can be moved or traversed in a direction, and the direction can either be linear or rotation. The handling of the substrate can therefore take on many forms and the connections to the substrate can be made such that the electric connection is moved or shifted to enable full de-plating of the material, even when the substrate is handled by a charged handler. The handler can take on many forms, and such forms may include rollers, grippers, plurality of pins or rollers with metallic connections at contact regions, such that the substrate can be supported, transported, rotated and otherwise handled.

For additional information with respect to the proximity head noted above, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. Patent Application, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. Patent Application, which is assigned to Lam Research Corporation, the assignee of the subject application, is incorporated herein by reference.

For additional information with respect to fluids, reference can be made to the exemplary processes and systems, as disclosed in U.S. patent application Ser. No. 11/513,634, filed on Aug. 30, 2006 and entitled "PROCESSES AND SYSTEMS FOR ENGINEEING A COPPER SURFACE FOR SELECTIVE METAL DEPOSITION". This U.S. Patent Application, which is assigned to Lam Research Corporation, the assignee of the subject application, is incorporated herein by reference.

For additional information about fluids, reference can be made to the exemplary processes and systems, as disclosed in U.S. patent application Ser. No. 11/514,038, filed on Aug. 30, 2006 and entitled "PROCESSES AND SYSTEMS FOR ENGINEERING A BARRIER SURFACE FOR COPPER DEPOSITION". This U.S. Patent Application, which is assigned to Lam Research Corporation, the assignee of the subject application, is incorporated herein by reference.

For additional information about fluids, reference can be made to the exemplary processes and systems, as disclosed in U.S. patent application Ser. No. 11/513,446, filed on Aug. 30, 2006 and entitled "PROCESSES AND SYSTEMS FOR ENGINEERING A SILICON-TYPE SURFACE FOR SELECTIVE METAL DEPOSITION TO FORM A METAL SILICIDE". This U.S. Patent Application, which is assigned to Lam Research Corporation, the assignee of the subject application, is incorporated herein by reference.

For additional information regarding plating fluids, plating materials or plating solutions, reference can be made to the exemplary solutions as disclosed in U.S. patent application Ser. No. 11/382,906, filed on May 11, 2006 and entitled "PLATING SOLUTION FOR ELECTROLESS DEPOSITION OF COPPER". This U.S. Patent Application, which is assigned to Lam Research Corporation, the assignee of the subject application, is incorporated herein by reference.

Additional information regarding plating fluids and plating solutions can be found by referencing the exemplary solutions as disclosed in U.S. patent application Ser. No. 11/472,266, filed on Jun. 28, 2006 and entitled "PLATING SOLUTIONS FOR ELECTROLESS DEPOSITION OF COPPER". This U.S. Patent Application, which is assigned to Lam Research Corporation, the assignee of the subject application, is incorporated herein by reference.

Aspects of the control, programming or interfacing may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, such as the carrier network discussed above, or it may be a general purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. For instance, in another embodiment, a meniscus can be formed to the size or larger than the substrate, and the substrate can be exposed to the meniscus in a clam shell operating-like process (to either one or both sides of the substrate). The clam shell operating-like process can also be used to de-plate the entire surface of the substrate, if the substrate is first place in position and then a fluid is allowed to contact the substrate surface. In such embodiments, the substrate is provided with electrical contact and the plating assembly is modified for size, handling, and/or support. Accordingly, it should be understood that many modification, permutations, adjustments and configuration are possible, so long as the basic elements of the claims that are appended hereto are understood in their broadest terms and application.

Accordingly, the present embodiments are to be considered as illustrative and not restrictive, and the invention is not to be limited to the details given herein, but may be modified within the scope and equivalents of the appended claims.

What is claimed is:

1. A substrate plating assembly comprising:

a delivery unit having an exterior surface and an interior chamber housing a consumable plating material, the interior chamber containing a plating fluid, the interior chamber having an opening interfaced by a first porous insert that allows the plating fluid to move in and out of the interior chamber of the delivery unit;

a receiving unit having an exterior surface and an interior volume housing a cathode, the cathode facilitating distribution of an electrical field, the interior volume of the receiving unit configured to hold at least part of the plating fluid, and the interior volume of the receiving unit having an opening interfaced by a second porous insert that allows the plating fluid to move in and out of the interior chamber of the receiving unit, such that the second porous insert is substantially aligned with the first porous insert, thereby defining a plating meniscus from the plating fluid between the first and second porous inserts; and a substrate path defined by a distance separating the delivery unit and the receiving unit, the meniscus being formed between the first porous insert and the second porous insert in the substrate path;

wherein the substrate path is configured to provide passage for a substrate, and a surface of the substrate capable of being plated when exposed to the plating fluid of the plating meniscus as the substrate is caused to move through the substrate path between the delivery unit and the receiving unit.

2. The substrate plating assembly as recited in claim 1, further comprising:
a first charge source, the first charge source is configured to be coupled to the consumable plating material in the delivery unit.

3. The substrate plating assembly as recited in claim 2, further comprising:
a second charge source, the second charge source is configured to be coupled to the cathode in the receiving unit.

4. The substrate plating assembly as recited in claim 3, wherein the second charge source is coupled to the substrate.

5. The substrate plating assembly as recited in claim 1, wherein the interior chamber of the delivery unit includes a plating fluid chamber and a pair of chambers for containing the consumable plating material.

6. The substrate plating assembly as recited in claim 5, wherein the plating fluid chamber is separated from each of the pair of chambers by a first and second membrane.

7. The substrate plating assembly as recited in claim 1, wherein the volume of the plating fluid forming the plating meniscus can be adjusted to maintain a stable meniscus based on the volume of plating fluid displaced by the wafer as it passes through the meniscus.

8. The substrate plating assembly as recited in claim 1, wherein the plating fluid is an electrolyte.

9. The substrate plating assembly as recited in claim 1, wherein the opening to the interior chamber of the delivery unit is on a bottom surface of the delivery plating head.

10. The substrate plating assembly as recited in claim 1, wherein the opening to the interior chamber of the receiving plating head is on a top surface of the receiving plating head.

11. The substrate plating assembly as recited in claim 1, further comprising:
a pre-wet top head defined in the delivery unit, the pre-wet head including a chamber capable of holding a pre-wet fluid and is interfaced with a first pre-wet porous insert having a first face exposed to the substrate path and a second face exposed to the chamber of the pre-wet top head; and
a pre-wet bottom head defined in the receiving unit, the pre-wet bottom head including a chamber capable of holding the pre-wet fluid and is interfaced with a second pre-wet porous insert having a first face exposed to the substrate path and a second face exposed to the chamber of the pre-wet bottom head, such that the second pre-wet porous insert is substantially aligned with the first pre-wet porous insert, thereby capable of defining a pre-wet meniscus from the pre-wet fluid between the first and second pre-wet porous inserts;
wherein the substrate path is configured to provide passage for the substrate, and the surface of the substrate is exposed to the pre-wet fluid of the pre-wet meniscus before the surface of the substrate is exposed to the plating fluid, as the substrate is caused to move through the substrate path between the delivery unit and the receiving unit.

12. A substrate plating assembly as recited in claim 1, further comprising:
a rinse/dry top head defined in the delivery unit including a plurality of ports capable of dispensing a rinsing fluid to the surface of the substrate and a plurality of ports capable of drawing a vacuum from the surface of the substrate; and
a rinse/dry bottom head defined in the receiving unit including a plurality of ports capable of dispensing the rinsing fluid to the surface of the substrate and a plurality of ports capable of drawing a vacuum from the surface of the substrate;
wherein the substrate is exposed to the rinsing fluid and vacuum as the substrate exits the substrate plating assembly.

13. A plating assembly for use in plating metallic materials onto a surface of a substrate, comprising:
a delivery unit having a fluid chamber, an anode, and a porous insert;
a receiving unit having a fluid chamber and a cathode, and a porous insert, the porous insert of the delivery unit being substantially aligned with and spaced apart from the porous insert of the receiving unit and the cathode being substantially aligned with the porous insert of the delivery unit;
a path being defined between the delivery unit and the receiving unit;
wherein a plating meniscus is defined in the path between the porous inserts of the delivery unit and the receiving unit and a substrate is capable of being moved through the plating meniscus to enable the plating of metallic materials onto the surface of the substrate.

14. The plating assembly as recited in claim 13, further comprising:
a first charge source, the first charge source is configured to be coupled to the anode.

15. The plating assembly as recited in claim 14, further comprising:
a second charge source, the second charge source is configured to be coupled to the cathode.

16. The plating assembly as recited in claim 15, wherein the second charge source is coupled to the substrate.

17. The plating assembly as recited in claim 13, further comprising:
a second fluid chamber and a second porous insert defined in the delivery unit;
a second fluid chamber and a second porous insert defined in the receiving unit, the second porous insert of the delivery unit substantially aligned and spaced apart from the second porous insert of the receiving unit;
wherein a pre-wet meniscus is capable of being defined in the path between the second porous insert defined in the delivery unit and the second porous insert defined in the receiving unit and the substrate is capable of being moved through the pre-wet meniscus before the substrate is exposed to the plating meniscus.

18. The plating assembly as recited in claim 13, further comprising:
a plurality of rinsing fluid ports capable of dispensing a rinsing fluid to the surface of the substrate and a plurality of vacuum ports capable of drawing a vacuum from the surface of the substrate, the plurality of rinsing fluid ports and the plurality of vacuum ports defined in the delivery unit;
a second plurality of rinsing fluid ports capable of dispensing a rinsing fluid to the surface of the substrate and a second plurality of vacuum ports capable of drawing a vacuum from the surface of the substrate, the second plurality of rinsing fluid ports and the second plurality of vacuum ports defined in the receiving unit;
wherein a cleaning area is defined in the path between the plurality of rinsing fluid ports defined in the delivery unit and the receiving unit, such that the cleaning area is positioned at an exit of the plating assembly.

* * * * *